United States Patent
Cho et al.

(10) Patent No.: US 7,466,138 B2
(45) Date of Patent: Dec. 16, 2008

(54) METHOD OF STRUCTURING COMPARATIVE REFERENCE VALUE USED IN BATTERY SOC ESTIMATING METHOD FOR DYNAMIC PATTERN

(75) Inventors: Il Cho, Daejeon (KR); Do Youn Kim, Daejeon (KR)

(73) Assignee: LG Chem, Ltd. (KR)

( * ) Notice: Subject to any disclaimer, the term of this patent is extended or adjusted under 35 U.S.C. 154(b) by 166 days.

(21) Appl. No.: 11/378,439

(22) Filed: Mar. 17, 2006

(65) Prior Publication Data
US 2006/0244458 A1  Nov. 2, 2006

(30) Foreign Application Priority Data
Mar. 17, 2005  (KR) .................. 10-2005-0022355

(51) Int. Cl.
    *G01N 27/416*  (2006.01)
(52) U.S. Cl. .................. 324/426; 324/427; 324/429; 320/134
(58) Field of Classification Search .................. 320/134; 324/426, 427, 429
    See application file for complete search history.

(56) References Cited

U.S. PATENT DOCUMENTS

| | | | | |
|---|---|---|---|---|
| 4,725,784 | A * | 2/1988 | Peled et al. | 324/427 |
| 6,011,379 | A * | 1/2000 | Singh et al. | 320/132 |
| 6,674,265 | B2 * | 1/2004 | Yoshida et al. | 320/125 |
| 7,136,762 | B2 * | 11/2006 | Ono | 702/63 |
| 2002/0109506 | A1 * | 8/2002 | Kawakami et al. | 324/522 |
| 2002/0145430 | A1 * | 10/2002 | Arai et al. | 324/426 |
| 2003/0052647 | A1 * | 3/2003 | Yoshida et al. | 320/125 |
| 2003/0214303 | A1 * | 11/2003 | Ying | 324/426 |
| 2004/0160224 | A1 * | 8/2004 | Yamazaki et al. | 324/426 |
| 2005/0024061 | A1 * | 2/2005 | Cox et al. | 324/426 |

FOREIGN PATENT DOCUMENTS

KR  1020050013972 A  2/2005

* cited by examiner

*Primary Examiner*—Akm E Ullah
*Assistant Examiner*—Nguyen Tran
(74) *Attorney, Agent, or Firm*—Cantor Colburn LLP

(57) ABSTRACT

Disclosed is a method for structuring a comparative reference value used to estimate a residual charge (SOC; State of Charge) of a battery. The method comprises comprising steps of: measuring open circuit voltages (OCV) and residual capacities (SOC) of a battery at various temperatures and tabling them according to the temperatures; measuring an open circuit voltage (OCV1) at a temperature before a test; carrying out a discharge capacity counting (Ah-counting) for the battery using a measurement apparatus while carrying out a dynamic pattern test; providing a sufficient relaxation time period for the battery after ending the dynamic pattern test; measuring an open circuit voltage (OCV2) at a temperature after the sufficient relaxation time period; obtaining residual capacity values of the battery corresponding to the measured open circuit voltages (OCV1, OCV2) from the table; assuming a difference between the above-obtained two residual capacity values as a $\delta SOC$ and calculating an 1C-rated capacity based on the $\delta SOC$; and applying the calculated rated capacity as a denominator of the discharge capacity counting to calculate an exact residual capacity of the battery.

1 Claim, 1 Drawing Sheet

METHOD OF STRUCTURING COMPARATIVE REFERENCE VALUE USED IN BATTERY SOC ESTIMATING METHOD FOR DYNAMIC PATTERN

BACKGROUND OF THE INVENTION

1. Field of the Invention

The present invention relates to a method for structuring a comparative reference value used to estimate a residual charge (SOC; State of Charge) of a battery, and more particularly to a method for structuring a comparative reference value capable of estimating a SOC of a battery more correctly using a discharge capacity counting (Ah counting) and an open circuit voltage (OCV) hysteresis depending on temperatures.

2. Description of the Prior Art

An electric vehicle uses electric energy stored in a battery as an energy source. A lithium-ion polymer battery is much used as the battery for the electric vehicle, and a research thereof has been also actively carried out.

In the mean time, since a gasoline vehicle drives an engine using the fuel, it is not difficult to measure an amount of the fuel. However, in case of the electric vehicle, it is difficult to measure residual energy accumulated in the battery. In the mean time, it is very important for a driver of the electric vehicle to know the information about how much the energy remains and to what extent the driver can drive.

In other words, since the electric vehicle is driven with the energy stored in the battery, it is very important to perceive the residual capacity of the battery. Accordingly, many technologies have been developed which measure the SOC of the battery during the traveling to notify the driver of the information about the possible distance covered.

In addition, many attempts have been also performed which properly set an initial value of the SOC of the battery before the traveling. At this time, the initial value of the SOC is set with reference to an open circuit voltage (OCV). In this method, the initial value is set on condition that the OCV is not changed depending on the environments and is an absolute reference value of the SOC.

However, according to many tests and theses, it has been proved that the OCV is changed depending on the temperatures and the aging, instead of having a fixed value irrespective of the environments. However, according to the conventional methods of setting an initial value of the SOC of the battery, it is not considered that the OCV is changed depending on the temperatures. Accordingly, the conventional methods cannot accurately estimate the SOC of the battery.

In the mean time, the SOC of the battery includes the discharge capacity counting having a current loss added thereto. Accordingly, it is very difficult to obtain a reference value of a comparison object thereof unless the current applied to the battery is correctly measured. In particular, in case of a battery exhibiting a dynamic pattern, an error thereof is varied depending on an error of a measuring apparatus and an environment of a measurement place, so that it is not easy to obtain a reference value thereof. Accordingly, an open circuit voltage after the battery is sufficiently relaxed is used as the reference value. However, this method can be applied to a battery exhibiting a static pattern. In other words, it cannot be applied to a battery exhibiting a dynamic pattern.

SUMMARY OF THE INVENTION

Accordingly, the present invention has been made to solve the above problem in that the conventional method sets a reference value with only an open circuit voltage and cannot be applied to a battery exhibiting a dynamic pattern. An object of the present invention is to provide a method for structuring a dynamic pattern reference value using a discharge capacity counting (Ah counting) and an open circuit voltage (OCV) hysteresis depending on temperatures.

In order to achieve the above object, there is provided a method for structuring a comparative reference value used to estimate a residual capacity of a battery for a dynamic pattern, the method comprising steps of: measuring open circuit voltages (OCV) and residual capacities (SOC) of a battery at various temperatures and tabling them according to the temperatures; measuring an open circuit voltage (OCV1) at a temperature before a test; carrying out a discharge capacity counting (Ah-counting) for the battery using a measurement apparatus while carrying out a dynamic pattern test; providing a sufficient relaxation time period for the battery after ending the dynamic pattern test; measuring an open circuit voltage (OCV2) at a temperature after the sufficient relaxation time period; obtaining residual capacity values of the battery corresponding to the measured open circuit voltages (OCV1, OCV2) from the table; assuming a difference between the above-obtained two residual capacity values as a δSOC and calculating an 1C-rated capacity based on the δSOC; and applying the calculated rated capacity as a denominator of the discharge capacity counting to calculate an exact residual capacity of the battery.

DETAILED DESCRIPTION OF THE PREFERRED EMBODIMENTS

Figure 1:
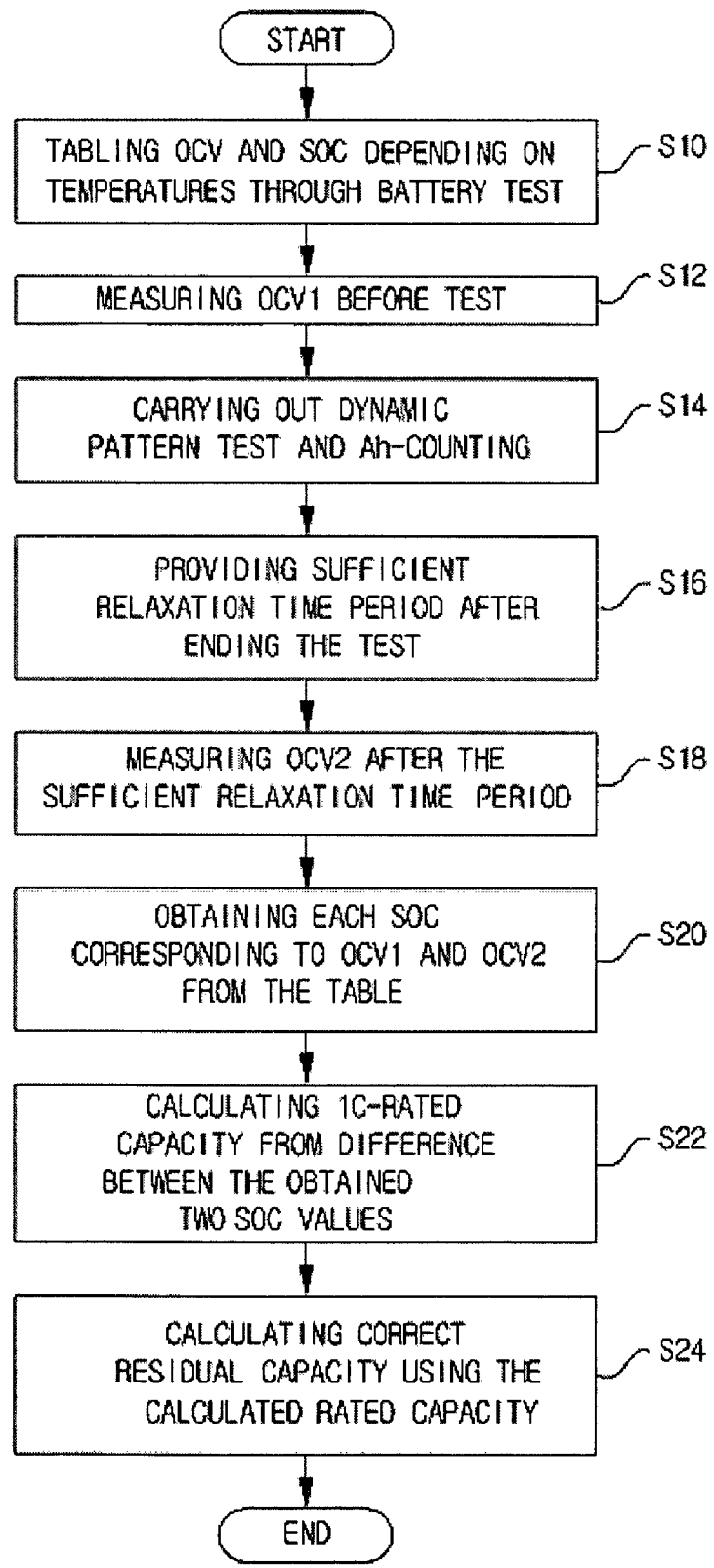
FIG. 1 is a flow chart showing a method according to an embodiment of the present invention.

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

As described above, an open circuit voltage (OCV) value is used to estimate a residual capacity (SOC) of a battery. The OCV has been conventionally used on assumption that it has a fixed value. However, since the OCV is varied depending on the environments, for example the temperatures or aging, the conventional method cannot be applied to a battery exhibiting a dynamic pattern. To the contrary, according to the present invention, it is provided a method for obtaining a reference value of a SOC for the dynamic pattern by using a discharge capacity counting and an OCV hysteresis depending on the temperatures.

More specifically, according to the present invention, the open circuit voltages are experimentally measured in advance at various temperatures at which a battery is actually operated and then a relationship between the OCV and the SOC at each of the temperatures is structured into a table (S10).

Subsequently, an open circuit voltage (OCV1) at a temperature before the test is measured (S12). Then, it is carried out a discharge capacity counting for the battery using a conventional measurement apparatus while carrying out a dynamic pattern test (S14).

Continuously, it is provided a sufficient relaxation time period for the battery after the dynamic pattern test (S16). In other words, the open circuit voltage (OCV) is a battery voltage under no-load state. However, when a voltage is applied, i.e., a current flows, it is deservedly changed into a voltage under load state from the OCV. In the mean time, the battery is not immediately changed into the no-load OCV even though the load is suddenly cut off. In other words, since the battery is subject to a chemical reaction, the battery is not changed into the complete OCV state until the reaction is sufficiently vanished. Such time period is referred to as a relaxation time period.

After the sufficient relaxation time period elapses, an open circuit voltage (OCV2) is measured at a temperature (S18). Then, the SOCs corresponding to the respective open circuit voltages (OCV1, OCV2) are obtained by referring to the above table (S20).

Next, a difference between the two SOC values obtained from the table is assumed as a $\delta$SOC and then a 1C-rated capacity is calculated, based on the the $\delta$SOC (S22). In the other words, the SOC is expressed as percentage of 1C-rated capacity, the whole SOC. And the temporary SOC is calculated by dividing the Ah-counting value by $\delta$SOC is expressed as percentage of 1C-rated capacity. Here, 100% SOC is meant by the 1C capacity itself, if the $\delta$SOC is 20%, the 1C capacity is $\delta$SOC×5. For example, if the calculated $\delta$SOC is 20% and the Ah-counting value is 1.5 Ah, the Ah-counting value 1.5 Ah corresponds to the 20% SOC. The 20% SOC is one-fifth of 100%, the 1C-rated capacity is 1.5 Ah×5, i.e., 7.5 Ah.

The calculated 1C-rated capacity is applied as a denominator of the Ah-counting to calculate an exact SOC. This calculated SOC becomes a SOC reference which serves as a comparative reference value in a SOC algorithm or other developments.

As described above, according to the prior art, only the OCV value is used on the assumption that it has a fixed value, so that is cannot be applied to the dynamic pattern and there occurs an error depending on the temperatures. However, according to the present invention, the discharge capacity counting and the OCV having a hysteresis are used together to obtain an actual SOC reference value having an error reduced even much which is then applied to the dynamic pattern test to structure a comparative reference value. As a result, it is possible to structure a more correct reference value.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for structuring a comparative reference value used to estimate a residual capacity of a batter for a dynamic pattern, the method comprising steps of:

measuring open circuit voltages (OCV) and residual capacities (SOC) of a battery at various temperatures and tabling them according to the temperatures;

measuring an open circuit voltage (OCV1) at a temperature before a test;

carrying out a discharge capacity counting (Ah-counting) for the battery using a measurement apparatus while carrying out a dynamic pattern test;

providing a sufficient relaxation time period for the battery after ending the dynamic pattern test;

measuring an open circuit voltage (OCV2) at a temperature after the sufficient relaxation time period;

obtaining residual capacity values of the battery corresponding to the measured open circuit voltages (OCV1, OCV2) from the table;

assuming a difference between the above-obtained two residual capacity values as a $\delta$SOC and calculating an 1C-rated capacity based on the $\delta$SOC and the discharge capacity counting value; and applying the calculated rated capacity as a denominator of the discharge capacity counting to calculate an exact residual capacity of the battery.

* * * * *